United States Patent
Bedell et al.

(10) Patent No.: US 9,818,901 B2
(45) Date of Patent: Nov. 14, 2017

(54) WAFER BONDED SOLAR CELLS AND FABRICATION METHODS

(75) Inventors: Stephen W. Bedell, Wappingers Falls, NY (US); Cheng-Wei Cheng, White Plains, NY (US); Jeehwan Kim, Los Angeles, CA (US); Devendra K. Sadana, Pleasantville, NY (US); Kuen-Ting Shiu, White Plains, NY (US); Norma E. Sosa Cortes, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 13/107,371

(22) Filed: May 13, 2011

(65) Prior Publication Data

US 2012/0285520 A1 Nov. 15, 2012

(51) Int. Cl.
*H01L 31/18* (2006.01)
*H01L 31/0687* (2012.01)

(52) U.S. Cl.
CPC .......... *H01L 31/0687* (2013.01); *H01L 31/18* (2013.01); *Y02E 10/544* (2013.01)

(58) Field of Classification Search
CPC .......... H01L 31/0725; H01L 31/06875; H01L 31/1836; H01L 31/1852; H01L 31/1892; H01L 2224/32145; H01L 21/2007; H01L 21/30604
USPC ........................................ 136/255
See application file for complete search history.

(56) References Cited

U.S. PATENT DOCUMENTS

| | | | |
|---|---|---|---|
| 4,292,461 A * | 9/1981 | Hovel | 136/249 |
| 6,100,166 A * | 8/2000 | Sakaguchi et al. | 438/455 |
| 6,316,332 B1 * | 11/2001 | Lo et al. | 438/455 |
| 6,340,788 B1 * | 1/2002 | King et al. | 136/261 |
| 6,951,819 B2 * | 10/2005 | Iles et al. | 438/705 |
| 7,719,020 B2 | 5/2010 | Murai et al. | |
| 7,846,759 B2 | 12/2010 | Atwater, Jr. et al. | |
| 7,863,157 B2 | 1/2011 | Henley et al. | |
| 2001/0033952 A1 * | 10/2001 | Jenson et al. | 429/7 |
| 2005/0161078 A1 | 7/2005 | Aiken | |
| 2006/0110844 A1 * | 5/2006 | Lee et al. | 438/57 |
| 2006/0112986 A1 * | 6/2006 | Atwater et al. | 136/255 |
| 2007/0032089 A1 * | 2/2007 | Nuzzo | H01L 21/02628 438/725 |
| 2009/0038678 A1 * | 2/2009 | Pan et al. | 136/255 |
| 2009/0117679 A1 * | 5/2009 | Fritzemeier | 438/46 |
| 2010/0031994 A1 * | 2/2010 | Varghese | 136/244 |
| 2010/0032008 A1 | 2/2010 | Adekore | |

(Continued)

OTHER PUBLICATIONS

Cao, Y., et al. "Effects of Dust Particles and Layer Properties on Organic Electronic Devices Fabricated by Stamping" Journal of Applied Physics, 98, 033713. 2005. pp. 1-6.

(Continued)

*Primary Examiner* — Golam Mowla
(74) *Attorney, Agent, or Firm* — Tutunjian & Bitetto, P.C.; Louis J. Percello

(57) ABSTRACT

A photovoltaic device and method for fabrication include multijunction cells, each cell having a material grown independently from the other and including different band gap energies. An interface is disposed between the cells and configured to wafer bond the cells wherein the cells are configured to be adjacent without regard to lattice mismatch.

13 Claims, 6 Drawing Sheets

(56) References Cited

U.S. PATENT DOCUMENTS

2010/0083999 A1* 4/2010 Hovel .................... B82Y 20/00
  136/244
2010/0116327 A1* 5/2010 Cornfeld ....................... 136/255
2010/0229933 A1 9/2010 Cornfeld
2010/0311250 A1 12/2010 Bedell et al.

OTHER PUBLICATIONS

Pode, R., et al. "Transparent Conducting Metal Electrode for Top Emission Organic Light-Emitting Devices: Ca—Ag Double Layer" Applied Physics Letters, vol. 84, No. 23. Jun. 2004. pp. 4614-4616.
Sharps, P., et al. "Wafer Bonding for Use in Mechanically Stacked Multi-Bandgap Cells" Photovoltaic Specialists Conference, 1997., Conference Record of the Twenty-Sixth IEEE. Sep.-Oct. 1997. pp. 895-898.
Takamoto, T. "Status of Multijunction Solar Cells and Future Development" CS MANTECH Conference. May 2009. (4 Pages).

* cited by examiner

WAFER BONDED SOLAR CELLS AND FABRICATION METHODS

BACKGROUND

Technical Field

The present invention relates to solar technology and more particularly to wafer bonded solar devices and fabrication methods to increase solar efficiency on multijunction solar cells.

Description of the Related Art

With growing concern about low-cost clean energy, solar power has again become a focal point for alternatives to fossil fuel energy production. Solar energy, while clean and sustainable, typically relies on expensive technologies for its implementation. These technologies include the incorporation of integrated circuits or integrated circuit technology into the fabrication of solar cells. The expense associated with current solar panels is a strong disincentive from moving in the direction of solar power.

Solar panels employ photovoltaic cells to generate current flow. When a photon hits silicon, the photon may be transmitted through the silicon, reflected off the surface, or absorbed by the silicon if the photon energy is higher than the silicon band gap value. This generates an electron-hole pair and sometimes heat, depending on the band structure. To achieve good carrier collection efficiency, multijunction cells have been developed. Multijunction cells include two or more cells stacked on top of each other. Any radiation transmitted through a top cell has a chance of being absorbed by a lower cell.

In theory, the more multijunction cells in a stack, the greater the overall efficiency should be. However, this is not the case with conventional devices. In practice, the efficiency of conventional tandem stacks progressively decreases from the theoretically estimated efficiency with each additional cell in the stack. For example, with a four cell stack the theoretical efficiency is about 50% and in practice the true efficiency is about 30%.

Tandem stacks suffer from many fabrication issues as well. As the stacks are grown (e.g., by epitaxial deposition methods), one on top of the other, lattice mismatches may occur between stack materials. This greatly affects material selection since the adjacent cells dictate which materials can be employed. Further, since band gap energies between adjacent cells need to be carefully selected, finding appropriate materials to form a tandem stack becomes extremely challenging.

SUMMARY

A photovoltaic device and method for fabrication include multijunction cells, each having a material grown independently from the other and including different band gap energies. An interface is disposed between the multijunction cells and configured to wafer bond the multijunction cells wherein the multijunction cells are configured to be adjacent without regard to lattice mismatch.

A method for forming a photovoltaic device includes forming an etch stop layer on a first wafer and growing a first material on the etch stop layer, the first wafer and the first material being lattice matched; wafer bonding the first material to a second wafer wherein the first material and the second wafer have different band gap energies; and removing the first wafer to the etch stop layer and removing the etch stop layer wherein the first material and the second wafer respectively form photo-responsive cells for the device.

Another method for forming a photovoltaic device includes providing a first wafer having at least one material layer; forming an etch stop layer on a second wafer and growing at least a second material on the etch stop layer, the second wafer and the second material being lattice matched; wafer bonding the second material to the first wafer using an interfacial buffer layer wherein the second material and the first wafer have different band gap energies; removing the second wafer to the etch stop layer; and removing the etch stop layer wherein the second material and the first wafer respectively form at least two photo-responsive cells for the device.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
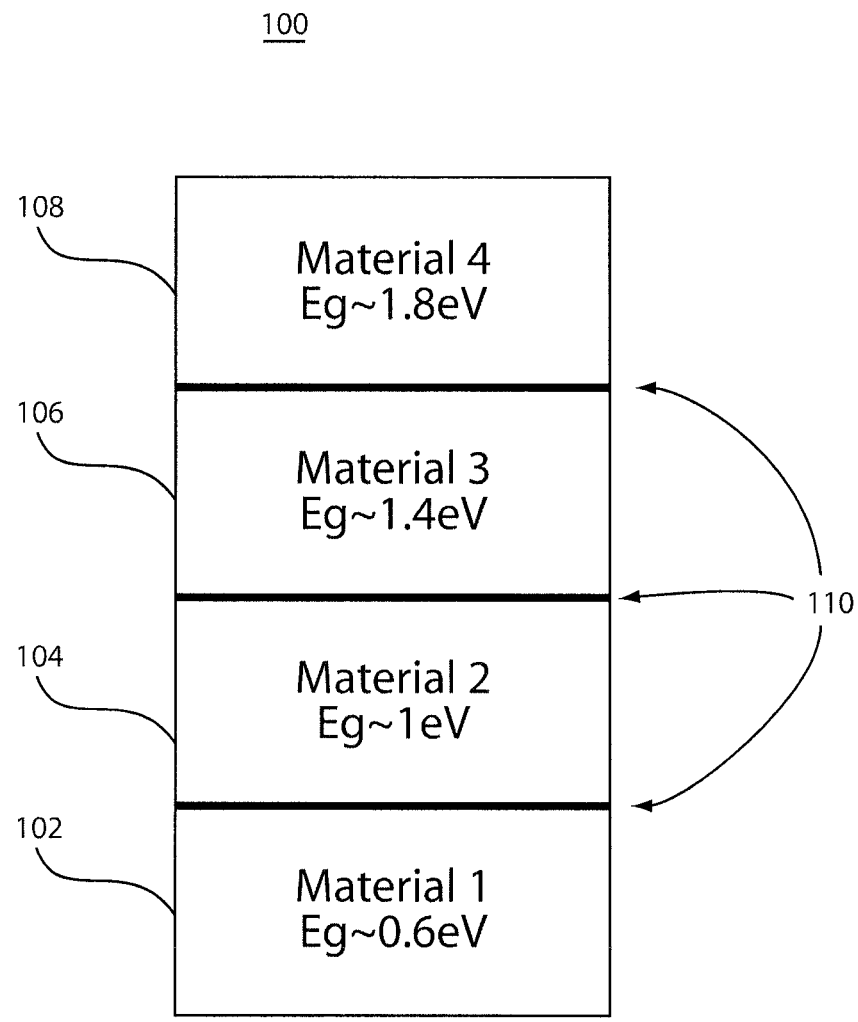
FIG. 1 is an illustrative cross-sectional view of a tandem stack of a photovoltaic device in accordance with one exemplary embodiment.

In accordance with the present principles, highly efficient multijunction solar devices and methods for fabricating these devices are provided. A tandem stack of cells is formed by employing wafer bonding using transparent interfacial layers. Wafer bonding with interfacial layers enables a choice of materials independent of lattice constants. Wafer bonding alone may lead to the formation of misfit dislocations since lattice relationships may still exist between two bonded materials. Therefore, interfacial layers are employed in accordance with the present principles. Wafers may be bonded by inserting ZnO, Au, Ag, indium tin oxide (ITO) or other films, preferably transparent, to avoid misfit dislocations between two materials.

The interfacial layers may take different forms. In one embodiment, the interfacial layer includes a metallic interlayer. In this embodiment, the wafers may be bonded by inserting ultra-thin metals for cold welding.

In another embodiment, the interfacial layer includes an oxide film such that hydrophilic bonding may be employed, e.g., using a transparent conducting oxide. A transparent conductive oxide (TCO) (e.g., instead of a $SiO_2$ material) promotes interfacial properties as well as tunnel junction conductivity leading to reduced series resistance of multijunction cells. Using conventional epitaxial growth of tandem structures suffers from threading and misfit dislocations. With wafer bonding without interfacial layers, the tandem structures may still have misfit dislocations. However, with wafer bonding using interfacial layers, both dislocations and threading can be avoided. Such films promote bonding quality, provide more conductive tunnel junctions and provide a light trapping effect that increases overall efficiency.

In the following description, numerous specific details are set forth, such as particular structures, components, materials, dimensions, processing steps and techniques to provide a thorough understanding of the present principles. However, it will be appreciated by one of ordinary skill in the art that these specific details are illustrative and should not be construed as limiting.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should also be understood that material compounds will be described in terms of listed elements, e.g., GaInP or InGaAs. These compounds include different proportions of the elements within the compound, e.g., InGaAs includes $In_{0.3}Ga_{0.7}As$, $In_{0.28}Ga_{0.72}As$, etc. In addition, other elements may be included in the compound, such as, e.g., AlInGaAs, and still function in accordance with the present principles.

The present embodiments may be part of a photovoltaic device or circuit, and the circuits as described herein may be part of a design for an integrated circuit chip, a solar cell, a light sensitive device, etc.

Methods as described herein may be used in the fabrication of photovoltaic devices, integrated circuit chips, etc. The resulting devices can be mounted in a single chip package (such as a plastic carrier, with leads that are affixed to a motherboard or other higher level carrier) or in a multichip package (such as a ceramic carrier that has either or both surface interconnections or buried interconnections). In any case, the device may then integrated with other chips, discrete circuit elements, and/or other signal processing devices as part of either (a) an intermediate product, such as a solar cell, or (b) an end product, such as a solar panel. The end product can be any product that includes integrated circuit chips, ranging from toys and other low-end applications to advanced computer products.

It is also to be understood that the present invention will be described in terms of a given illustrative architecture having a particular tandem (multijunction) structure; however, other architectures, structures, substrate materials and process features and steps may be varied within the scope of the present invention. The tandem structure includes cells, which will be described in terms of a particular material. While each cell includes a p-doped layer, an n-doped layer and perhaps an undoped intrinsic layer, the n-doped layer and p-doped layers will be omitted from the FIGS. and the description for ease of explanation. Instead, for simplicity, each cell layer will be described in terms of a base layer material and a band gap associated with the base layer. The n-doped and p-doped regions may be formed by doping during epitaxial growth or doped after formation by any known implantation or diffusion process. Note that in III-V tandem cells, no intrinsic layer is needed in the cell.

Referring now to the drawings in which like numerals represent the same or similar elements and initially to FIG. 1, an illustrative multijunction cell stack 100 is shown for a photovoltaic device in accordance with one exemplary embodiment. The photovoltaic device may be part of a circuit and/or may include a design for an integrated circuit chip, a photovoltaic device, a photosensitive circuit, etc. The photovoltaic device of tandem stack 100 may be employed in solar cells, light sensors, photosensitive devices or other photovoltaic applications.

Stack 100 illustratively includes four layers although a greater number or lesser number of layers may be employed in accordance with the present principles. In this embodiment, cells 102, 104, 106 and 108 are stacked and wafer bonded to each other. In the embodiment shown, cell 108 is a top cell. The top cell is the cell where radiation initially falls incident. In the embodiment, each cell is bonded to its adjacent cell and includes an interfacial buffer 110 for enabling hydrophilic, cold weld or other bonding methods. The interfacial buffer or layer 110 may include ZnO, Au, Ag, indium tin oxide (ITO) or other suitable transparent conductive oxides (TCOs) or soft metals, such as, e.g., Ca—Ag layers, etc. The buffer materials should be transparent for light which is absorbable in lower cell layers.

Hydrophilic bonding may include applying pressure (e.g., about 200 kPa) at a moderate temperature (e.g., 100-300 degrees C. followed by annealing at a higher temperature (e.g., 500-600 degrees C.). Other types of bonds may also be employed, including, e.g., cold welds, contact welds, adhesive bonding, etc. Cold welding is particularly useful with metal interfacial layers. Metal layers, such as Au, Ag, etc. provide good weld strength when layer thicknesses are maintained below about 100 nm. The metal may be deposited or flashed on both surfaces and welded at low temperature (e.g., room temperature) by applying sufficient pressure, e.g., about 200 kPa. Other process parameters are also contemplated. A heat treatment may be applied (e.g., about 500-600 degrees C.) to further achieve covalent bonding of the interface.

It should be understood that the bonding parameters will depend on the type of materials being bonded, the application, the bond strength and other considerations. By way of example, the temperature ranges for eutectic (or cold welding) and hydrophilic bonding may range from about 100 degrees C. to about 600 degrees C. The pressure range for eutectic (or cold welding) and hydrophilic bonding may range from about 100 Pa to about 100 MPa.

Each cell 102, 104, 106 and 108 is separately manufactured and bonded using wafer bonding. Lattice mismatches between layers or cells are no longer an issue since each cell is grown separately and connected later by bonding using an interfacial layer. This provides complete flexibility in material selection.

To increase the performance of the device 100, it is desirable that any radiation that passes through the top cell 108 is absorbed in the lower cells 102, 104 and 106. This is achieved by providing energy gap splitting ($E_g$ splitting). For example, the top cell 108 has higher band gap materials and receives light first. The light spectra that are not absorbed at the top cell 108 enter the cell 106. A larger band gap difference between two different junctions is better to prevent the light spectra from being shared between the junctions. This is to maximize photocurrent. Energy gap splitting permits the absorption of radiation with different energies between the cells. Since the band gap of the top cell 108 is maintained at a higher level, the lower level cells (106, 104, 102) are designed to have a lower band gap. In this way, the lower cells have a higher probability of absorbing transmitted radiation, and the entire multifunction cell becomes more efficient since there are fewer photon energy levels shared between the layered cells. This results in an increased probability of absorbing light passing through to the bottom cell 102 hence increasing the current in the lower cells 102, 104, 106 and increasing short circuit current, $J_{SC}$.

A solar cell may be described in terms of a fill factor (FF). FF is a ratio of the maximum power point ($P_m$) divided by open circuit voltage ($V_{oc}$) and short circuit current $$(J_{sc}): FF = \frac{P_m}{V_{oc} J_{sc}}.$$

The fill factor is directly affected by the values of a cell's series and shunt resistance. The increased efficiency of photovoltaic devices is of utmost importance in the current energy environment.

To increase efficiency, it is preferable that a greater difference between band gaps exists between the top cell 108 (higher band gap), and the bottom cell 102 (lower band gap) by keeping an absolute high level of band gap energy ($E_g$) for all cells to maintain high Voc.

In FIG. 1, a particularly useful embodiment is shown. Cell 102 includes a material 1, which includes a band gap energy of approximately 0.6 eV. Cell 104 includes a material 2, which includes a band gap energy of approximately 1.0 eV. Cell 106 includes a material 3, which includes a band gap energy of approximately 1.4 eV. Cell 108 includes a material 4, which includes a band gap energy of approximately 1.8 eV. The band gap energies presented here are illustrative of one desirable combination. Other combinations are also contemplated.

Figure 2C:
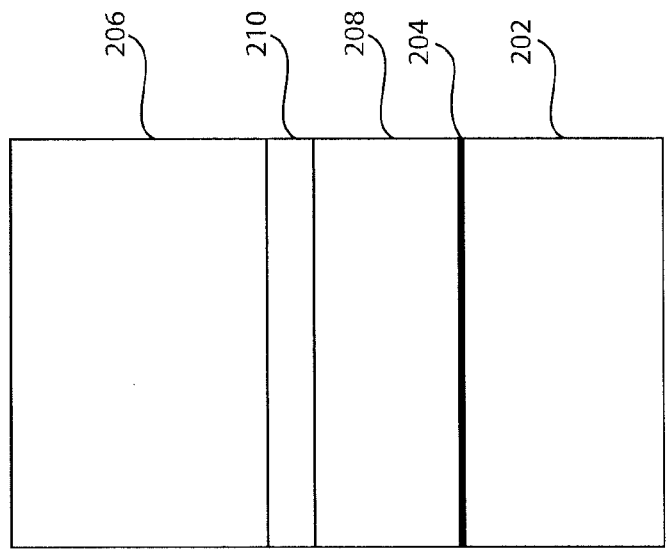
FIG. 2C is an illustrative cross-sectional view showing the wafer of FIG. 2B wafer bonded to the material grown of the second wafer in accordance with the present principles.
Figure 2B:
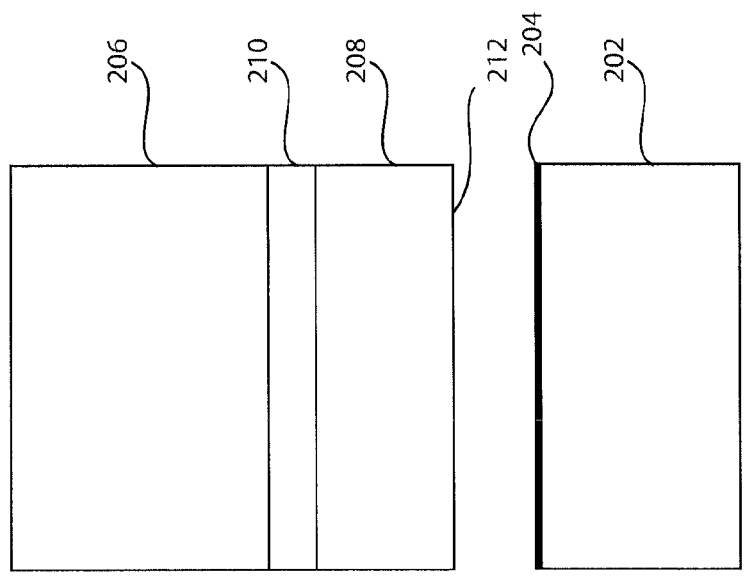
FIG. 2B is an illustrative cross-sectional view of the wafer of FIG. 2A being joined with a second wafer having an etch stop layer and cell material grown thereon in accordance with the present principles.
Figure 2A:
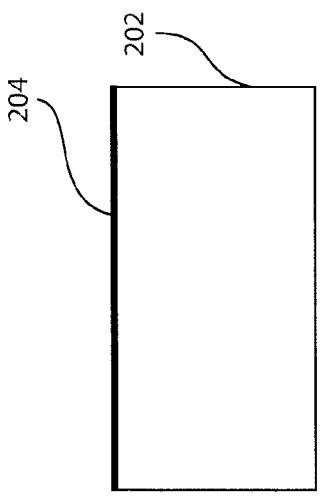
FIG. 2A is an illustrative cross-sectional view of a wafer having an interface or buffer layer formed thereon in accordance with the present principles.

Referring to FIGS. 2A-2E, a wafer bonding process for illustratively bonding two cells is shown. In FIG. 2A, a wafer 202 includes a material grown to have a specified band gap. The wafer 202 may include a single element crystal or may include a crystal structure including multiple elements. The wafer 202 may be doped or otherwise treated or prepared to include n-doped and p-doped regions and/or to provide the specified band gap for that cell. Wafer 202 may also include one or more other material layers employed in forming multijunction cells. For example, wafer 202 may include a substrate layer and an epitaxially grown layer, such that the substrate layer forms a first cell and the grown layer forms a second cell. In another embodiment, an additional etch stop layer (not shown) may be formed on wafer 202 between the substrate layer and an epitaxially grown layer (not shown) such that the epitaxially grown layer will be employed for the solar cell and the substrate layer and etch stop layer are to be removed by etching.

A buffer layer 204 is formed on the wafer 202 which is employed in bonding the wafer 202 to other components. The buffer layer may include a transparent conductor such as ZnO, Indium Tin oxide (ITO) or may include an ultra-thin metal, such as, Ag, Au, etc.

In FIG. 2B, a second wafer 206 includes an epitaxially grown material 208 for a second cell. The wafer 206 is processed to form an etch stop layer 210 and grow the material 208, which is preferably grown by, e.g., an epitaxial growth process. A surface 212 may be doped to form a doped region or may otherwise be prepared or treated to enable bonding.

The material of etch stop layer 210 is preferably formed by epitaxial growth. The etch stop layer 210 will preferably be a different material from both the material of substrate layer 206 and the grown layer 208. For example, $In_{0.5}Ga_{0.5}P$, $In_{0.5}Al_{0.5}P$, $Al_{(x)}GaAs$ (x>0.4), InGaAlP, etc. are good candidates for etch stop layer 210 if the substrate 206 is GaAs. Note that the lattice mismatch between the etch stop layer 210 and the substrate 206 depends on the lattice constants of both materials.

In FIG. 2C, wafer 202 is bonded to material 208 using layer 204. The bonding may include a hydrophilic bonding process (employing a proper pressure and elevated temperature), a cold weld or other bonding process. The bonding process rigidly attaches the wafer 202 to material 208. These two materials are bonded through a transparent interface 204, and the materials 202 and 208 do not need to be lattice matched.

Figure 2E:
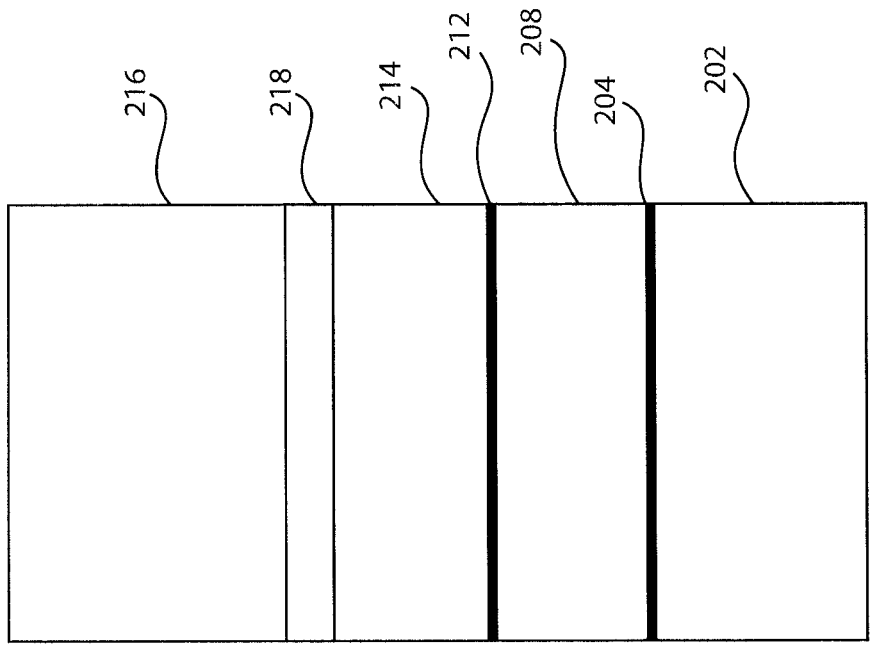
FIG. 2E is an illustrative cross-sectional view showing another cell being added to the stack of FIG. 2D in accordance with the present principles.
Figure 2D:
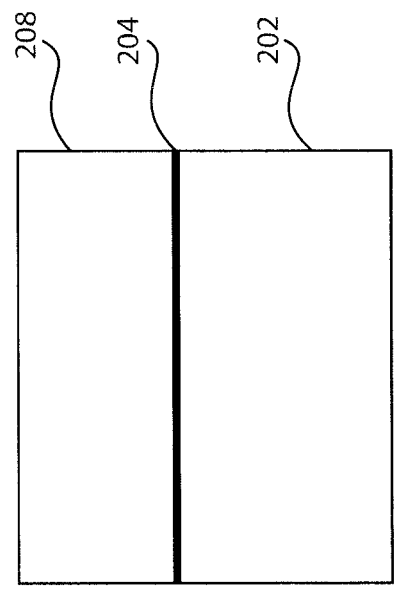
FIG. 2D is an illustrative cross-sectional view showing the etch stop layer and the second wafer removed to form a multijunction stack in accordance with the present principles.

In FIG. 2D, wafer 206 is etched back or ground down to the etch stop layer 210. The etch stop layer 210 is removed by a selective etch to expose material 208. Material 208 may have a band gap energy that is greater than wafer 202 if material 208 is closer to a top of the multijunction device being assembled. For example, wafer 202 may have a band gap energy of about 0.6 eV while material 208 may have a band gap energy of about 1.0 eV. Alternately, the tandem stack may be assembled from the top down. In that case, e.g., material 208 would have a band gap energy that is less than wafer 202.

Referring to FIG. 2E, the bonding and etch back process can continue by forming a buffer layer 212 on material 208 (and/or on material layer 214) and attaching another material layer 214 with a wafer 216 and an etch stop layer 218 to continue the tandem stack in accordance with the present principles. Layer 214 may be an epitaxially grown layer on the wafer or substrate 216, while etch stop layer 218 is grown and is disposed between layers 214 and 216. Before the process of etch back, the structure 214, 216 and 218 is bonded on buffer layer 212, with the epitaxial layer 214 facing layer 208. The etch back process starts by selectively etching substrate 216 from etch stop layer 218 via either a wet chemical or a dry etching process. Once the substrate 216 is totally etched away, the etch stop layer 218 is then removed by another wet chemical or dry etching recipe. A finished four cell stack as depicted in FIG. 1 may eventually result with continued processing although fewer than four cells may also be provided.

Figure 3A:
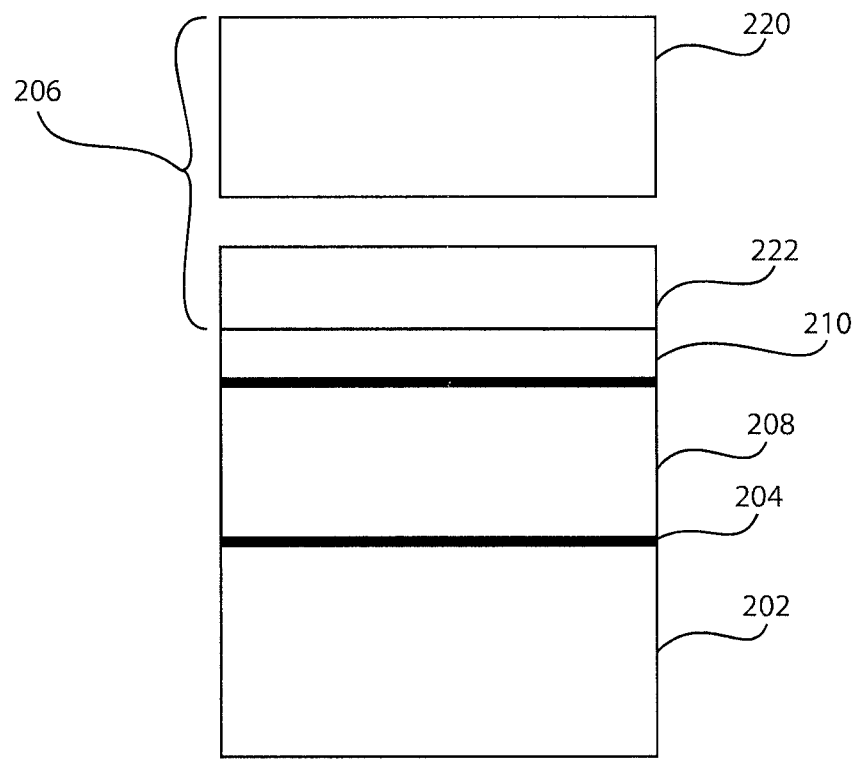
FIG. 3A is an illustrative cross-sectional view showing the second wafer of FIG. 2B spalled and cleaved to reduce a thickness of the second wafer in accordance with another embodiment.

Referring to FIG. 3A, the structure of FIG. 2B may be subjected to a spalling process to reduce the amount of grinding or etch back of the wafer 206. The spalling process includes applying mechanical stress to the wafer 206 to cause a cleave to propagate through the wafer 206 causing the wafer 206 to split into portions 220 and 222.

The mechanical stress in the spalling process may be caused by depositing a layer under tensile stress on the surface of the wafer to be split. A stressed metal layer (for example, Ni, Ti, W, Cr, alone or in combination) may be employed. To control the spalling process a surface handling layer (such as a tape) may be applied to the surface of the deposited stressed metal layer. Mechanical removal of the handling layer will result in the removal of the stressed metal and the portion 220 of the wafer 206. Illustrative values for the stress of an exemplary Ni layer may be between about 200 and 1000 MPa with a corresponding stressor thickness of between about 50 microns and 1 micron (lower stress requires thicker layers) as described in commonly assigned US Application Number US2010/0311250A1 to Bedell et al., incorporated herein by reference.

Figure 3B:
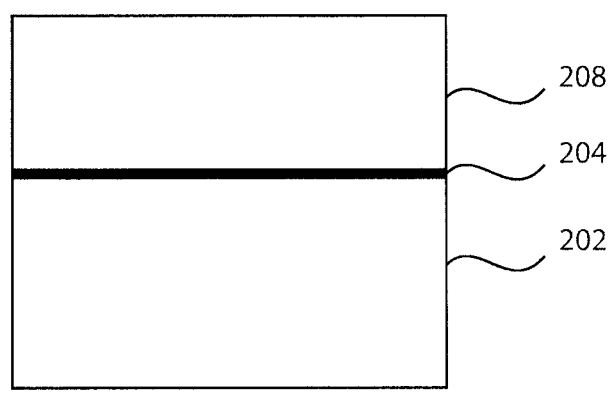
FIG. 3B is an illustrative cross-sectional view showing the etch stop layer and a remaining portion of the second wafer removed to form a multijunction stack in accordance with the present principles.

Portion 222 is then etched back to form the structure in FIG. 3B. The processing can continue until a multijunction device is completed (e.g., FIG. 1).

Figure 4:
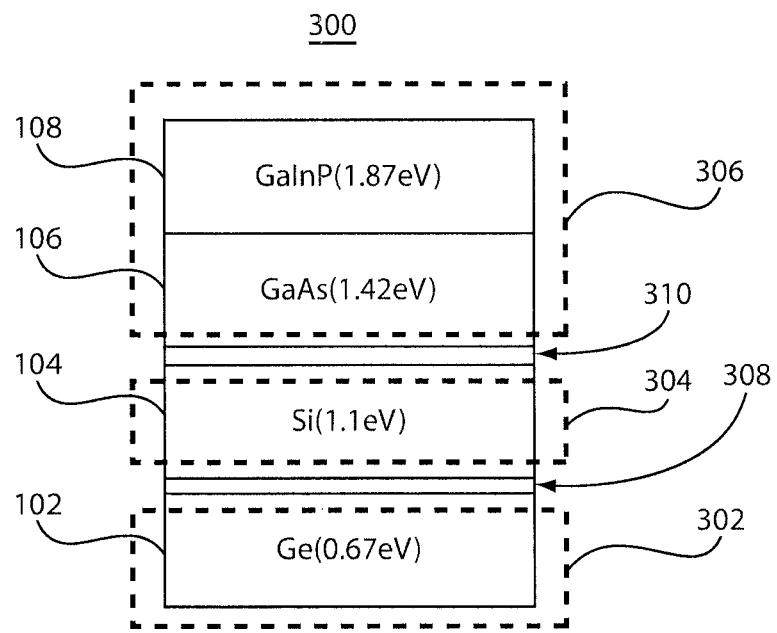
FIG. 4 is an illustrative cross-sectional view of a multijunction stack of a photovoltaic device having Si as a third cell in accordance with one exemplary embodiment.

Referring to FIG. 4, an example of a four cell tandem stack 300 is illustratively depicted. In this example, approximate band gap energies for the cells depicted in FIG. 1 are employed. Material 1 or cell 102 includes Ge ($E_g$=0.67 eV), material 3 of cell 106 includes GaAs ($E_g$=1.42 eV), and material 4 of cell 108 includes GaInP ($E_g$=1.87 eV). Material 2 of cell 104 is preferably about 1 eV. This band gap energy is difficult to achieve given the lattice constants of materials in cells 102 and 106. In this embodiment, Si is selected ($E_g$=1.1 eV). In accordance with the present principles, material of cells 106 and 108 may be grown together. For example, the GaAs of cell 106 may have AlInGaP (for the GaInP cell 108) grown directly on the cell 106. The cell 104 of Si and cell 102 of Ge may each be separate wafers.

In this example, three wafers are employed (302, 304, and 306). The three wafers 302, 304 and 306 include a bond interface 308 between wafers 302 and 304 and a bond interface 310 between wafers 304 and 306. It should be understood that Ge, Si and GaAs are common substrate materials and their use simplifies the design. While each of the four cells 102, 104, 106 and 108 may be separately fabricated and bonded together, a lattice match made between any two adjacent materials by epitaxially growing one material on the other to reduce the number of bonding interfaces. For example, the GaAs and GaInP cells may be epitaxially grown together before the bonding process.

Figure 5:
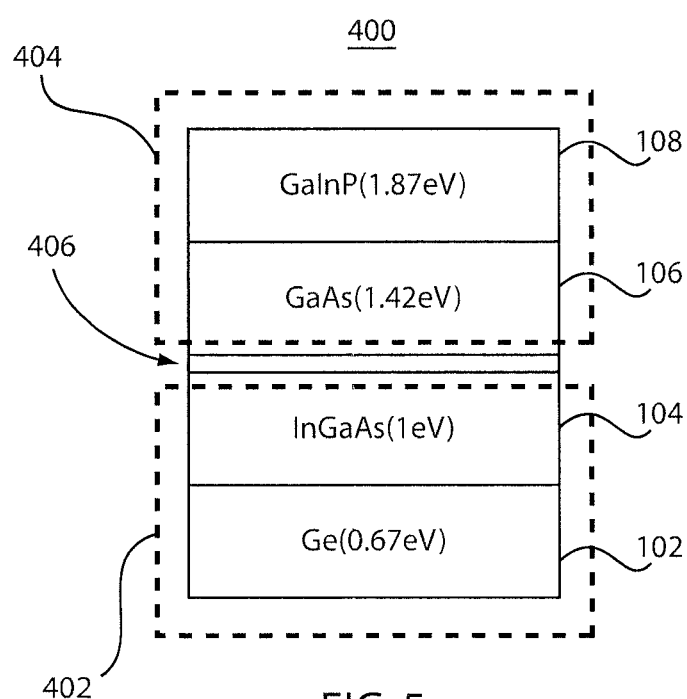
FIG. 5 is an illustrative cross-sectional view of a tandem stack of a photovoltaic device having InGaAs as a third cell in accordance with another exemplary embodiment.

Referring to FIG. 5, another example of a four cell tandem stack 400 is illustratively depicted. In this example, the band gap energies depicted for the cells of FIG. 1 are also desired. Material of cell 102 again includes Ge ($E_g$=0.67 eV), material of cell 106 again includes GaAs ($E_g$=1.42 eV), and material of cell 108 again includes GaInP ($E_g$=1.87 eV). The band gap energy of material of cell 104 is preferably about 1 eV, which is difficult to achieve given the lattice constants of the materials of cells 102 and 106.

In this example, $In_{0.3}Ga_{0.7}As$ (or equivalent) is selected ($E_g$=1.0 eV). In accordance with the present principles, materials of cells 106 and 108 may be grown together as described above. Likewise, materials of cells 102 and 104 may be grown together. For example, the Ge of cell 102 may have $In_{0.3}Ga_{0.7}As$ (for cell 104) grown directly on the cell 102 by an epitaxial growth process. The cell 104 of $In_{0.3}Ga_{0.7}As$ and cell 102 of Ge may provide a first wafer 402. Cells 106 and 108 may provide a second wafer 404. Wafers 402 and 404 may be bonded together such that only one bond interface 406 is needed. Cells 106/108 can be lattice matched. Cells 102/104 may be formed together by growing InGaAs with a low threading dislocation density, e.g., less than $1\times10^6/cm^2$, by providing a grading epitaxial growth from the GaAs to $In_{0.3}Ga_{0.7}As$ within cell 104 and to assist in closer lattice matching between cells 102 and 104. Wafers 402 and 404 do not need to be lattice matched and are instead wafer bonded to avoid the lattice mismatch issue.

It should be understood that in alternate embodiments, each layer of multijunction device 400 may be separately grown and bonded. This would include four interfaces as described above (e.g., for FIG. 1).

Figure 6:
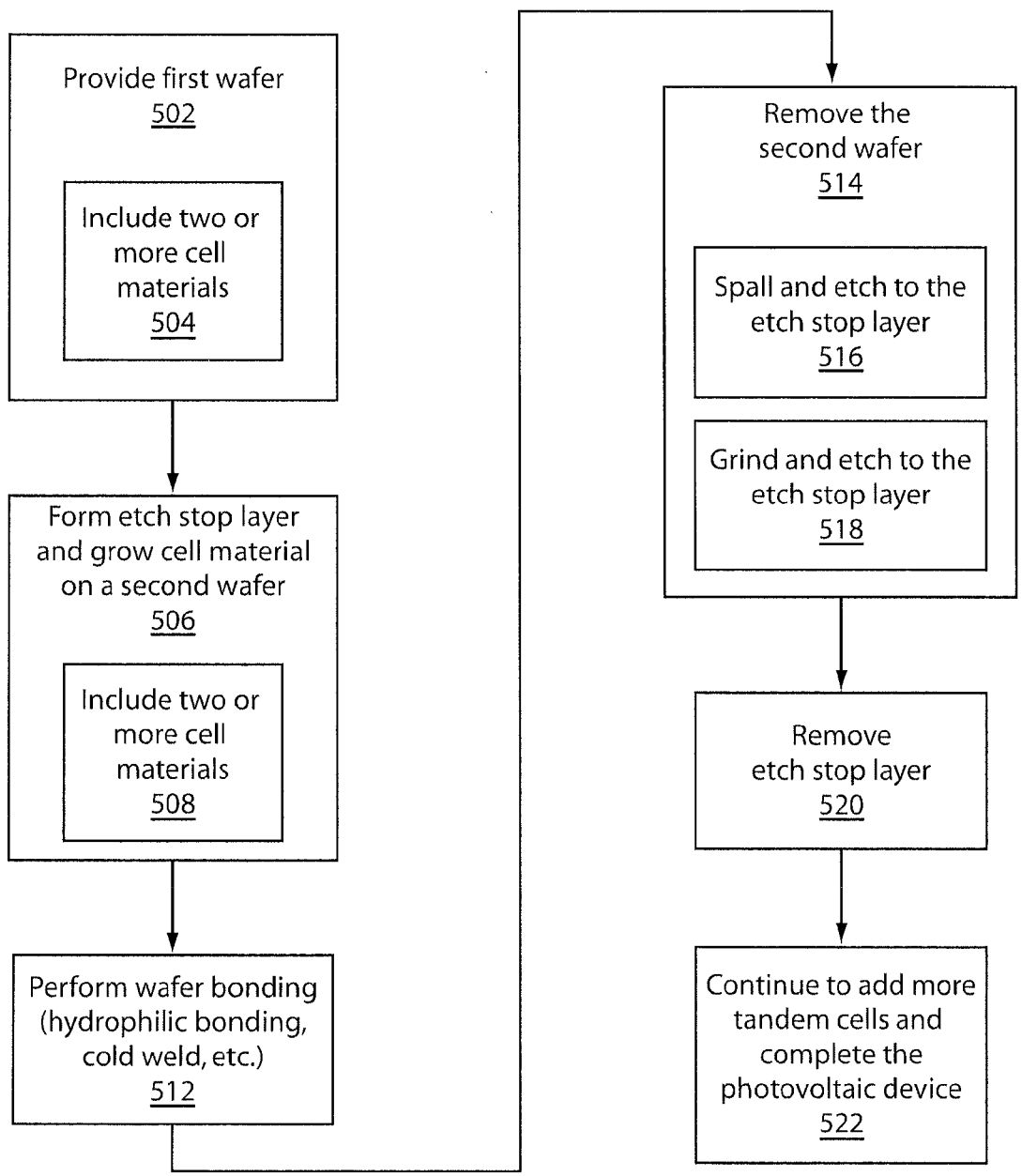
FIG. 6 is a block/flow diagram showing a method for fabricating a tandem stack using wafer bonding in accordance with the present principles.

Referring to FIG. 6, a method for forming a photovoltaic device is illustratively shown. In block 502, a first wafer is provided. The first wafer may include n-doped and p-doped upper and lower regions. The doped regions may be formed during growth of the wafer or the wafer may be doped after formation. In one embodiment, the first wafer may include two or more materials which could result in the formation of corresponding multijunction cells in block 504. These materials do not have to be lattice-matched to each other, but are preferably lattice matched if one cell material is grown on the other.

In block 506, an etch stop layer is formed on a second wafer and a material is grown on the etch stop layer. The etch stop layer may include a material that permits lattice-matched epitaxial growth so that the material formed on the etch stop layer is lattice matched to the second wafer. In one embodiment, the material on the second wafer may include two or more materials where each material could result in the formation of a separate multijunction cell in block 508. For example, a material may be grown on the etch stop layer and a next material may be grown on the material formed on the etch stop layer. These materials and the etch stop layer are preferably lattice matched and each of the materials may be prepared to function as independent multijunction cells. Additional layers of materials may be employed for forming additional multijunction cells.

In block 512, wafer bonding is performed to bond the material on the second wafer to the first wafer. The materials of the multijunction cells have different band gap energies. The different bandgap energies have values that vary in descending order from the top cell of the device. The wafer bonding includes forming an interface buffer layer. The interface layer may include at least one of Ag, Au, ZnO, ITO or other TCOs or metals.

The wafer bonding may include at least one of hydrophilic bonding, eutectic bonding, cold welding, adhesion bonding, etc. The cold weld bonding may be performed at high pressure (e.g., 200 kPa) and room temperature. After that, the temperature is increased to about 500-600 degrees C. to further facilitate covalent bonding formation. The temperatures and pressure are illustrative and may be adjusted as needed depending on the condition and materials employed.

In block 514, the second wafer is removed down to the etch stop layer. In block 516, this may include spalling the first wafer to remove a thickness of the first wafer; and etching a remaining portion of the first wafer down to the etch stop layer. In block 518, this may alternately include grinding or etching the first wafer to remove a thickness of the first wafer; and etching a remaining portion of the first wafer down to the etch stop layer.

In block 520, the etch stop layer is removed so that at least the material on the second wafer and the first wafer form multijunction cells for the device. In block 522, wafer bonding and other steps are continued to provide additional multijunction cells and complete the photovoltaic device.

In particularly useful embodiments, a photovoltaic device may include four multijunction cells. The four multijunction cells may include four separately grown materials coupled by three wafer bonded interfaces, or certain layers may be grown on other materials (e.g., a base layer or substrate) to reduce the number of interfaces. The grown layers would need to be lattice matched to their base layer. In one embodiment, four multijunction cells are formed which include a top cell with a band gap energy of about 1.8 electron-volts, a second cell adjacent to the top cell with a band gap energy of about 1.4 electron-volts, a third cell adjacent to the second cell with a band gap energy of about 1.0 electron-volts and a bottom cell adjacent to the third cell with a band gap energy of about 0.6 electron-volts. The top cell may include GaInP, the second cell may include GaAs, the third cell may include Si and the bottom cell may include Ge. In another embodiment, the top cell may include GaInP, the second cell may include GaAs, the third cell may include InGaAs and the bottom cell may include Ge.

Having described preferred embodiments for wafer bonded solar cells and fabrication methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
    forming an etch stop layer on a first wafer and growing a first material directly on the etch stop layer, the first wafer and the first material being lattice matched;
    wafer bonding the first material to a second wafer using an interface layer of a transparent conductive material that directly contacts the first material and the second wafer, wherein the first material and the second wafer have different band gap energies;
    removing the first wafer from the etch stop layer and removing the etch stop layer after wafer bonding said first material to said second wafer, wherein the first wafer is partially removed by spalling the first wafer to remove a thickness of the first wafer by depositing a metal layer of Ni, W, Cr, or a combination thereof, under tensile stress directly on a surface of the first wafer to apply a mechanical stress that causes a cleave to propagate through the entire wafer, wherein the metal layer has a thickness between about 50 microns and 1 micron, and etching a remaining portion of the first wafer down to the etch stop layer; and
    wafer bonding the second wafer to a third wafer, after removing the first wafer, using an interface layer of a transparent conductive material that directly contacts the second wafer and the third wafer, wherein the second wafer and the third wafer have different band gap energies,
    wherein the first material, the second wafer, and the third wafer respectively form photo-responsive cells for the device.

2. The method as recited in claim 1, wherein the interface layer includes ZnO or indium tin oxide.

3. The method as recited in claim 1, wherein wafer bonding includes at least one of hydrophilic bonding, eutectic bonding, adhesion bonding or cold welding.

4. The method as recited in claim 1, wherein removing the first wafer to the etch stop layer includes:
    grinding or etching the first wafer to remove a thickness of the first wafer; and
    etching a remaining portion of the first wafer down to the etch stop layer.

5. The method as recited in claim 1, further comprising continuing to wafer bond cells on the device.

6. The method as recited in claim 5, wherein the cells include four cells and the four cells include four separately grown materials coupled by three wafer bonded interfaces.

7. The method as recited in claim 1, wherein growing a first material on the etch stop layer further includes growing a second material on the first material which is lattice matched to the first material such that cells are formed by the first and second materials.

8. The method as recited in claim 1, wherein the second wafer includes a third material grown thereon and lattice matched to the second wafer such that the second wafer and the third material form cells.

9. The method as recited in claim 1, wherein four cells are formed which include a top cell with a band gap energy of about 1.8 electron-volts, a second cell adjacent to the top cell with a band gap energy of about 1.4 electron-volts, a third cell adjacent to the second cell with a band gap energy of about 1.0 electron-volts and a bottom cell adjacent to the third cell with a band gap energy of about 0.6 electron-volts.

10. The method as recited in claim 8, wherein the top cell includes GaInP, the second cell includes GaAs, the third cell includes Si and the bottom cell includes Ge.

11. The method as recited in claim 8, wherein the top cell includes GaInP, the second cell includes GaAs, the third cell includes InGaAs and the bottom cell includes Ge.

12. A method for forming a photovoltaic device, comprising:
    providing a first wafer having at least one material layer;
    forming an etch stop layer on a second wafer and growing at least a second material directly on the etch stop layer, the second wafer and the second material being lattice matched;
    wafer bonding the second material to the first wafer using an interfacial buffer layer that includes one of a transparent conductive material or at least one metal layer and that directly contacts the first wafer and the second material, wherein the second material and the first wafer have different band gap energies;
    removing the second wafer from the etch stop layer after said step of wafer bonding by:
        spalling the second wafer to remove a thickness of the second wafer by depositing a metal layer of Ni, W, Cr, or a combination thereof, under tensile stress directly on a surface of the second wafer to apply a mechanical stress that causes a cleave to propagate through the entire wafer; and
        etching a remaining portion of the second wafer down to the etch stop layer; and
    removing the etch stop layer wherein the second material and the first wafer respectively form at least two photo-responsive cells for the device.

13. The method of claim 1, wherein the first material is a single, homogeneous layer.

\* \* \* \* \*